(12) United States Patent
Lopez et al.

(10) Patent No.: US 6,844,548 B2
(45) Date of Patent: Jan. 18, 2005

(54) WIEN FILTER AND ELECTRON MICROSCOPE USING SAME

(75) Inventors: G. Martinez Lopez, Madrid (ES); Katsushige Tsuno, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 10/360,605

(22) Filed: Feb. 7, 2003

(65) Prior Publication Data

US 2003/0226975 A1 Dec. 11, 2003

(30) Foreign Application Priority Data

Feb. 8, 2002 (JP) .......................................... 2002-31993

(51) Int. Cl.[7] .............................................. H01J 37/147
(52) U.S. Cl. ................................... 250/305; 250/396 R
(58) Field of Search ........................................ 250/305

(56) References Cited

U.S. PATENT DOCUMENTS 4,962,313 A * 10/1990 Rose ........................... 250/311

OTHER PUBLICATIONS

"Aberration Analysis of a Crossed-field Analyzer", of Tian-Tong Tang, *Optik 74*, No. 2 (1986), pp. 51–56.

"Simulation of Electron Trajectories of Wien Filter for High-Resolution EELS Installed in TEM,"Katsushige Tsuno and John Rouse, *J Electron Microsc 45*, pp. 417–427 (1996).

"The retarding Wien filter as a high-performance imaging filter", of H. Rose, *Optik 77*, No. 1 (1987), pp. 26–34.

* cited by examiner

*Primary Examiner*—John R. Lee
*Assistant Examiner*—Phillip A Johnston
(74) *Attorney, Agent, or Firm*—Webb Ziesenheim Logsdon Orkin & Hanson, P.C.

(57) ABSTRACT

A Wien filter is provided in which a less amount of secondary aberration is produced than conventional. This filter has 12 poles. These poles have front ends facing the optical axis. These front ends have a 12-fold rotational symmetry about the optical axis within the XY-plane perpendicular to the optical axis.

11 Claims, 9 Drawing Sheets

WIEN FILTER AND ELECTRON MICROSCOPE USING SAME

BACKGROUND OF THE INVENTION

1. Field of the Invention

The present invention relates to a Wien filter (E×B filter) used in an energy filter for use in an electron microscope, mass filter, spin rotator, monochrometer, energy analyzer, or the like. The present invention also relates to an electron microscope using such a Wien filter.

2. Description of Related Art

Accelerated charged particles, such as electrons, are deflected toward positive poles with respect to an electric field. With respect to a magnetic field, the particles are deflected perpendicular to the direction of travel of the particles and to the magnetic field. A Wien filter makes use of these phenomena and uses electric and magnetic fields that are placed perpendicular to each other within a plane perpendicular to the direction of travel of the charged-particle beam. The beam is made to move straight in a certain direction.

The condition under which a charged-particle beam goes straight through a Wien filter is known as the Wien condition and given by $$E_1 = vB_1$$

where $E_1$ is the first-order component (dipole component) of the electric field, $B_1$ is the first-order component (dipole component) of the magnetic field, and v is the velocity of the charged particles.

It has been considered that the Wien condition can be satisfied within the inner area excluding the vicinities (known as fringing fields) of the entrance and exit for the beam, for the following reason. Where the electrodes and magnetic polepieces are different in geometry, the electric and magnetic fields are different in distribution and, therefore, the Wien condition holds in some locations but does not in other locations. The magnetic pole pieces may be hereinafter often referred to as magnetic poles or simply as poles.

A Wien filter in which electrodes and magnetic polepieces are identical in geometry has been proposed by Tang (*Optik*, 74, No. 2 (1986), pages 51–56, "Aberration Analysis of a Crossed-Field Analyzer", Tian-Tong Tang). This is an octopole filter, and the electrodes and magnetic polepieces are identical in geometry. Therefore, the problem that the fringing fields do not satisfy the Wien condition can be circumvented. Hence, a Wien filter having theoretically expected performance can be accomplished.

However, when the Tang's filter is put into practical use, a drawback occurs. The filter has eight poles that are used as individual electrodes and magnetic polepieces. These electrodes and magnetic polepieces create their respective dipole and quadrupole components. In consequence, a number of power supplies are necessary. In practice, Wien filters are often used floating on high voltages to provide large dispersion. It is not practical to place a number of power supplies in locations at high electric potentials. For these reasons, the Tang's filter has not been put into practical use.

On the other hand, we have proposed a practical octopole filter (Japanese Patent No. 3040245), which is shown in FIG. 9, (a) and (b). This filter has greater poles $P_1$, $P_3$, $P_5$, and $P_7$ and smaller poles $P_2$, $P_4$, $P_6$, and $P_8$, i.e., eight poles in total. The poles $P_2$, $P_3$ and $P_4$ together form a magnetic pole pair via a coil C1. Similarly, the poles $P_6$, $P_7$ and $P_8$ together form a magnetic pole pair via a coil C2. The poles $P_2$, $P_1$ and $P_8$ together form an electrode pair. Similarly, the poles $P_4$, $P_5$ and $P_6$ together form an electrode pair.

The poles $P_2$, $P_1$, and $P_8$ are fabricated integrally. Similarly, the poles $P_4$, $P_5$, and $P_6$ are fabricated integrally. The poles $P_2$, $P_4$, $P_6$, and $P_8$ are bent at their intermediate locations to facilitate winding the coil C1 between the poles $P_2$ and $P_4$ across the pole $P_3$ and winding the coil C2 between the poles $P_6$ and $P_8$ across the pole $P_7$.

Because of this arrangement of the electrodes and magnetic polepieces, the Wien filter can be operated with only three input terminals and three power supplies. One of the three input terminals is used to supply current into the coils C1 and C2 at ground potential. Another input terminal is used for a positive voltage. The remaining input terminal is used for a negative potential. It is known that stigmatic focusing can be achieved under the condition $$\frac{E_2}{E_1} - \frac{B_2}{B_1} = -\frac{1}{4}R_0 \qquad (1)$$

where $E_2$ is the quadrupole component of the electric field, $B_2$ is the quadrupole component of the magnetic field, and $R_0$ is the cyclotron radius of the charged particles where the magnetic field exists alone and given by $$R_0 = \frac{mv^2}{eE_1} \qquad (2)$$

where v is the velocity of the charged particles, m is the mass of the charged particles, and e is the charge of the charged particles.

A quadrupole electric field for achieving stigmatic focusing by satisfying the above-described condition may be realized also by varying the ratio of the absolute values of voltages applied to the poles $P_2$, $P_1$, $P_8$ and to the poles $P_4$, $P_5$, and $P_6$, but this is not strictly true. Therefore, it is better to fulfill the condition by producing a quadrupole electric field using four poles $P_1$, $P_3$, $P_5$, and $P_7$ (i.e., with addition of the poles $P_3$ and $P_7$).

These circumstances are described in detail in J. Electron Microsc., 45, pages 417–427 (1996), "Simulation of Electron Trajectories of Wien Filter for High-Resolution EELS Installed in TEM" (K. Tsuno and J. Rouse).

In the Wien filter (octopole filter) described in the above-cited Japanese Patent No. 3040245, the electrodes are exactly identical in geometry with the magnetic polepieces. Therefore, charged particles are not deflected at the fringes. In practice, the instrument has been put into practical use as a monochrometer, and has excellent ease of use. However, it has still been difficult to reduce the aberration down to zero. Generally, a Wien filter has a considerably large amount of second-order aberration. Where it is used as a monochrometer, the size of the charged-particle beam going out of the filter is greater than that of the beam yet to enter the filter.

With respect to the second-order aberration of the Wien filter, H. Rose has already shown a condition capable of making it zero (*Optik*, 77, No. 1 (1987), pages 26–34, "The retarding Wien filter as a high-performance imaging filter", H. Rose).

This condition is given by Eqs. (3) to (9).

$$e_2 = -1 \quad (3)$$

$$b_2 = -\frac{3}{4} \quad (4)$$

$$e_3 - b_3 = \frac{3}{8} \quad (5)$$

where $$e_2 = \left(\frac{E_2}{E_1}\right) R_0 \quad (6)$$

$$b_2 = \left(\frac{B_2}{B_1}\right) R_0 \quad (7)$$

$$e_3 = \left(\frac{E_3}{E_1}\right) R_0^2 \quad (8)$$

$$b_3 = \left(\frac{B_3}{B_1}\right) R_0^2 \quad (9)$$

where $E_1$ and $B_1$ are the dipole components of the electric and magnetic fields, respectively, $E_2$ and $B_2$ are quadrupole components of the fields, respectively, $E_3$ is the high-order inhomogeneous component of the electric field $E_1$, $B_3$ is the high-order inhomogeneous component of the magnetic field $B_1$.

Among these conditions, $e_2$ and $b_2$ can be achieved relatively easily, for the following reason. The condition for achieving stigmatic focusing is expressed by Eq. (1) and given by $$\frac{E_2}{E_1} - \frac{B_2}{B_1} = e_2 - b_2 = -\frac{1}{4} R_0$$

Therefore, it suffices to determine the relation between $e_2$ and $b_2$ so as to satisfy this condition.

With respect to $e_3$ and $b_3$, we have made a simulation to know the value of the high-order inhomogeneous component $E_3$ of the electric field in the above-described octopole filter. In this simulation, a numerical computation method known as boundary element method (BEM) was used. In particular, geometric parameters of the Wien filter (i.e., radius R of the cylindrical portion within the XY-plane perpendicular to the direction of travel of the charged particles, angular positions of the poles, polar interval, and length $L_0$ taken in the direction of the Z-axis) were calculated. Various conditions including voltages for producing the dipole and quadrupole fields were established. The distributions of the potentials φ of the dipole and quadrupole fields and of the hexapole field parasitic to the dipole field were calculated. The dipole, quadrupole, and hexapole fields are respectively given by (dipole field):

$$\phi_1 = \phi_0 - E_1 x + (1/8) E_1''(x^3 + y^2 x) + \quad (10)$$

where $$E_1'' = \frac{\partial^2 E_1}{\partial z^2}$$

(quadrupole field):

$$\phi_2 = -\{E_2 - (1/12) E_2''(x^2 + y^2)\}(x^2 - y^2) + \quad (11)$$

(hexapole field):

$$\phi_3 = -E_3(x^3 + 3xy^2) + \quad (12)$$

Therefore, the electric field potential φ on the x-axis, for example, is given by $$\phi = \phi_1 + \phi_2 + \phi_3 + \ldots = \phi_0 - E_1 x + E_2 x^2 - (1/8) E_1'' x^3 - E_3 x^3 + (1/12) E_2'' x^4 + \quad (13)$$

In the foregoing, it is assumed that the radius R of the cylindrical portion is 5 mm, L=40 mm, and accelerating voltage is 2.5 kV. Furthermore, the dipole electric field= 1651.1734 V, quadrupole electric field=280.7162 V, dipole magnetic field=44.3101 AT, and quadrupole magnetic field= 6.5412 AT.

FIGS. 8(a) and 8(b) show the distribution of the high-order inhomogeneous component $E_3$ along the optical axis where a dipole electric field of 1 V is applied. As can be seen from this graph, the high-order inhomogeneous component $E_3$ has a high value of 12000 V/m³ in the fringing fields. In FIG. 8(a), the horizontal axis indicates the direction of travel (Z-axis direction) of charged particles through an octopole Wien filter shown in FIG. 8(b). The vertical axis indicates the high-order inhomogeneous component $E_3$ of the electric field.

It is possible to reduce the high-order inhomogeneous component $E_3$ close to zero outside the fringing fields by adjusting the angular positions of the poles. However, the component stays at large values in the fringing fields and cannot be reduced to a small value. The same situation applies to the high-order inhomogeneous component $B_3$ of the magnetic field. Therefore, the conventional Wien filter has the problem that the second-order aberration cannot be reduced.

SUMMARY OF THE INVENTION

It is an object of the present invention to provide a Wien filter which displays less amount of secondary aberration than conventional.

The Wien filter of the present invention has 12 poles. Within the XY-plane perpendicular to the optical axis, the front ends of the poles facing the optical axis have a 12-fold rotational symmetry about the optical axis.

Furthermore, the present invention provides an electron microscope designed to cause an electron beam produced from an electron gun to hit a sample via a Wien filter that passes only electrons having a certain energy. The Wien filter has an optical axis substantially parallel to the Z-axis and produces at least a dipole electric field in the X-axis direction and a dipole magnetic field in the Y-axis direction. This filter has 12 poles extending substantially parallel to the optical axis in the Z-axis direction. The front ends of the poles facing the optical axis have a 12-fold rotational symmetry about the optical axis within the XY-plane.

Other objects and features of the present invention will appear in the course of the description thereof, which follows.

BRIEF DESCRIPTION OF THE DRAWINGS

FIG. 7(a) shows an embodiment in which the Wien filter according to the present invention is placed between an FEG and an accelerator and FIG. 7(b) shows an embodiment in which the Wien filter is placed behind the accelerator;

DESCRIPTION OF THE PREFERRED EMBODIMENTS

Wien filters according to embodiments of the present invention are hereinafter described by referring to FIGS. 1–5.

Referring to FIGS. 1–4, there is shown a Wien filter according to one embodiment of the present invention. Generally, this filter has an optical axis O parallel to the Z-axis direction, and produces at least a dipole electric field $E_1$ in the X-axis direction and a dipole magnetic field $B_1$ in the Y-axis direction. The filter is fitted with 12 poles $P_1$ to $P_{12}$ extending substantially parallel to the optical axis O. The front ends $P_1'$ to $P_{12}'$ of the poles $P_1$ to $P_{12}$ which face the optical axis O have a 12-fold rotational symmetry about the optical axis O within the XY-plane. The X-, Y-, and Z-axes are mutually orthogonal Cartesian axes. The 12 poles $P_1$ to $P_{12}$ are made of a magnetic material such as iron, nickel, or Permalloy. The Wien filter is described in further detail below.

Figure 1:
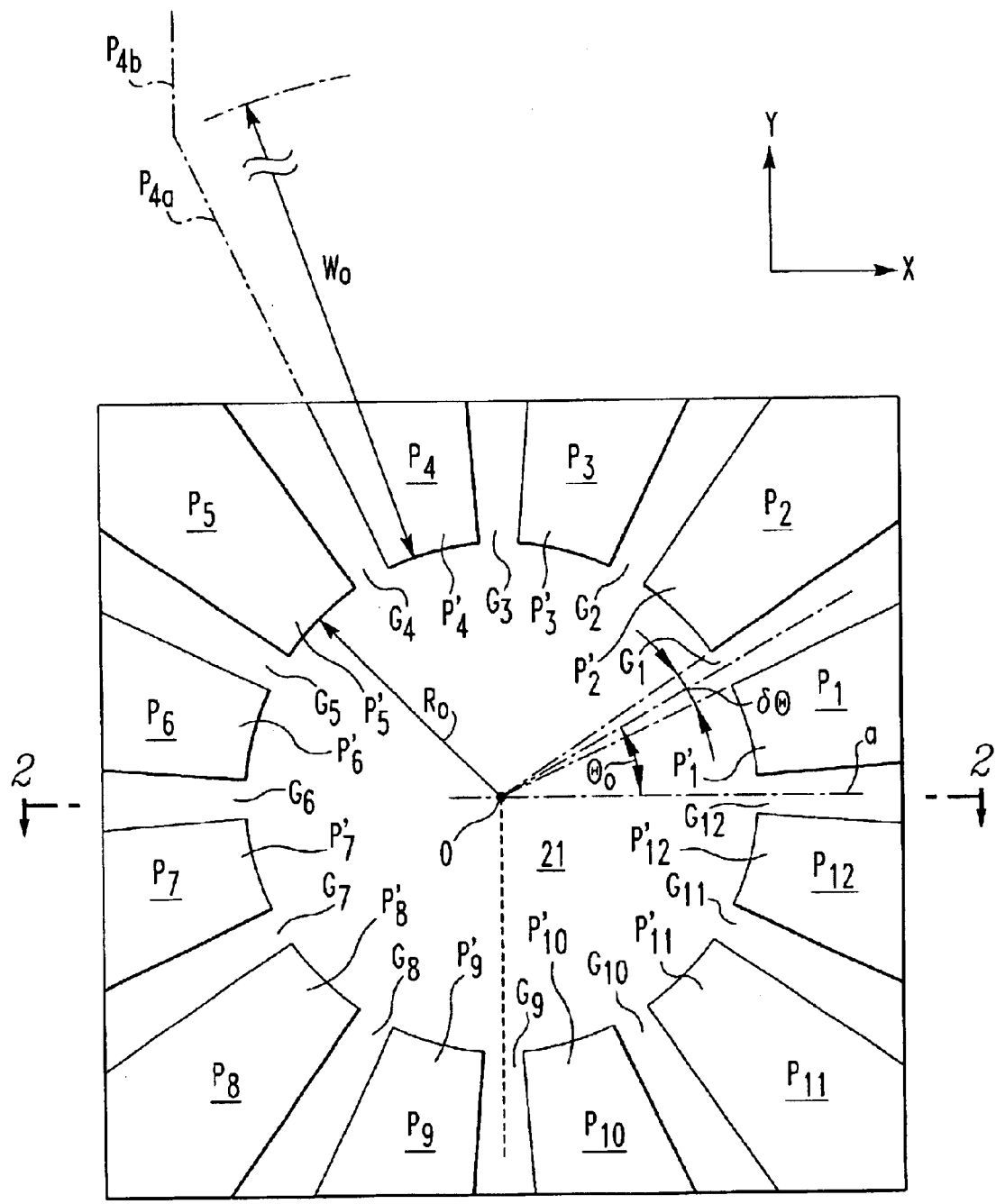
FIG. 1 is a cross-sectional view taken along the XY-plane perpendicular to the optical axis of a Wien filter according to a first embodiment of the present invention, it being noted that FIG. 1 is also a cross-sectional view taken along line 1—1 of FIG. 2.
Figure 2:
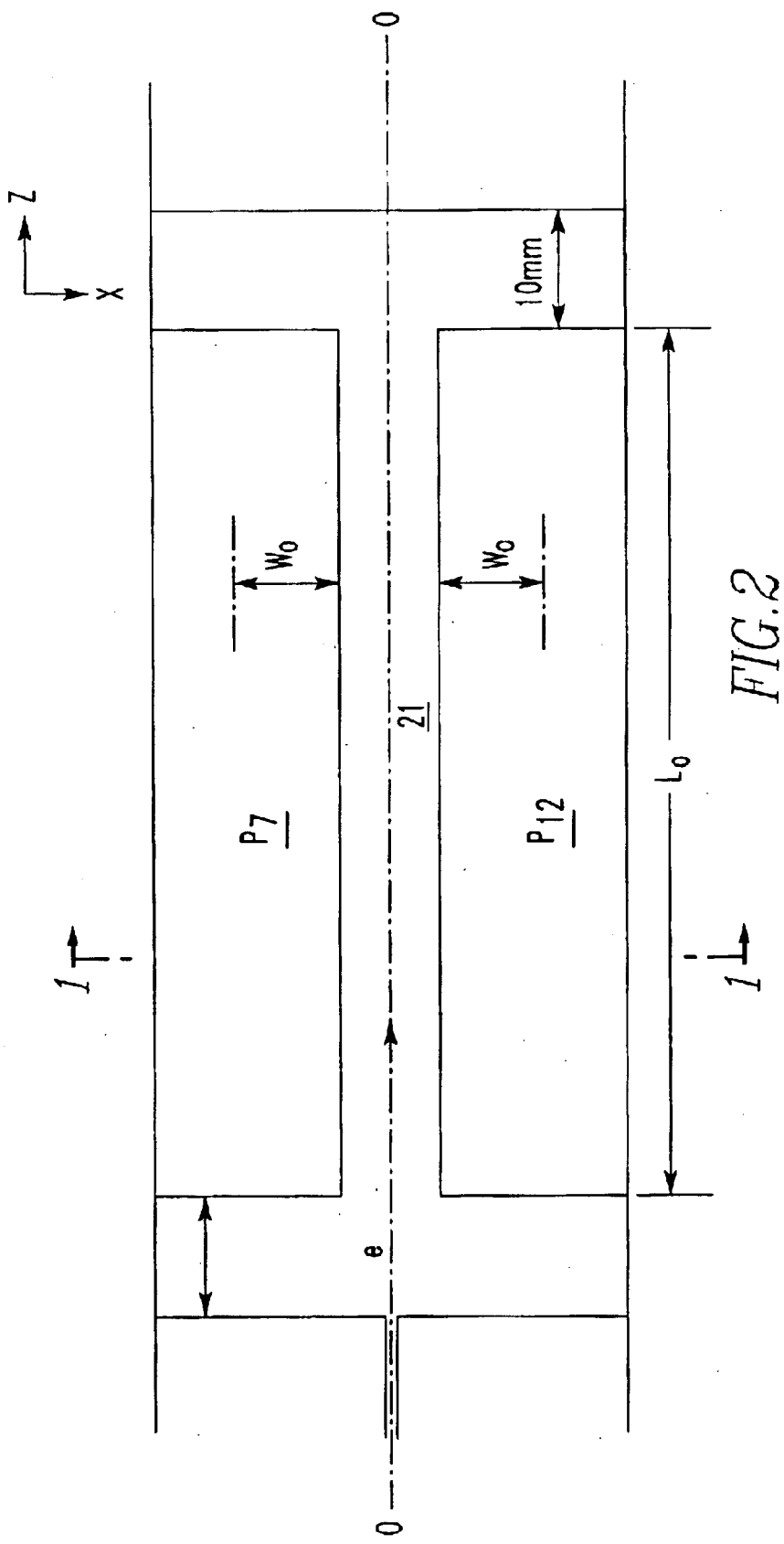
FIG. 2 is a cross-sectional view taken along the XZ-plane of the Wien filter shown in FIG. 1, and in which the Z-axis is coincident with the optical axis, FIG. 2 being also a cross-sectional view taken along line 2—2 of FIG. 1.

As shown in FIGS. 1 and 2, the Wien filter according to this embodiment has the 12 poles $P_1$ to $P_{12}$ extending parallel to the optical axis O to create an electromagnetic field of a desired distribution inside a cylindrical space 21 through which electrons, i.e., charged particles, pass. The center axis of the space 21 is coincident with the optical axis O.

As shown in FIG. 1, the 12 poles $P_1$ to $P_{12}$ have front ends $P_1'$ and $P_{12}'$, respectively, which face the optical axis O and have a 12-fold rotational symmetry about the optical axis O within the XY-plane. More specifically, the front ends $P_1'$ to $P_{12}'$ of the poles $P_1$ to $P_{12}$ are all identical in shape and dimensions. The front ends $P_1'$ to $P_{12}'$ are regularly spaced from each other. Therefore, the angle $\theta_0$ made between the circumferentially successively adjacent center positions of the gaps $G_1$ to $G_{12}$ between the front ends or between the circumferentially successively adjacent center positions of the front ends $P_1'$ to $P_{12}'$ is 30°. The angle from the circumferentially center position of each of the gaps $G_1$ to $G_{12}$ between the front ends to a respective one of the circumferentially center positions of the front ends $P_1'$ to $P_{12}'$ is 15°. For example, in FIG. 1, the angles from the positive side of the X-axis (that agrees with a straight line drawn from the center O to the circumferentially midway point of the gap $G_{12}$ in FIG. 1) to the circumferentially center positions of the poles $P_1$ and $P_{12}$ are ±15°. The angles from the positive side of the X-axis to the circumferentially center positions of the poles $P_6$ and $P_7$ are ±165°. Also in FIG. 1, the angles from the positive side of the Y-axis to the circumferentially center positions of the poles $P_4$ and $P_3$ are ±15°. The angles from the positive side of the Y-axis to the circumferentially center positions of the poles $P_9$ and $P_{10}$ are ±165°.

The adjacent ones of the front ends $P_1'$ to $P_{12}'$ form gaps $G_1$ to $G_{12}$, respectively, which are identical in shape and dimensions. Preferably, the width (i.e., the space between adjacent poles $P_i$ and $P_{i+1}$) of each of the gaps $G_1$ to $G_{12}$ increases with the radius from the center O as shown.

The shape and dimensions of the front ends $P_1'$ to $P_{12}'$ can be analogous and close to those of a Wien filter according to an embodiment described below.

The radial length or width of each of the poles $P_1$ to $P_{12}$ can be made comparable to the diameter $2R_0$ of the cylindrical space 21, for example.

Each of the poles $P_1$ to $P_{12}$ can be bent in an appropriate direction (e.g., to be parallel to the Y-axis) at a distance of $W_0$ (see FIG. 1) from the end facing the optical axis or cylindrical space 21. The distance $W_0$ is approximately equal to the diameter $2R_0$ of the cylindrical space 21. In particular, the pole $P_4$, for example, has a side surface $P_{4a}$ extending in the direction of the radius of $R_0$ inside a location that is at a distance of $W_0$ from the foremost end and a side surface $P_{4b}$ extending in the Y-axis direction outside this location at a distance of $W_0$ as indicated by the phantom lines in FIG. 1.

Because of this structure, where a magnetomotive force is applied to each of the poles $P_1$ to $P_{12}$, a coil can be easily wound to each pole.

Figure 3:
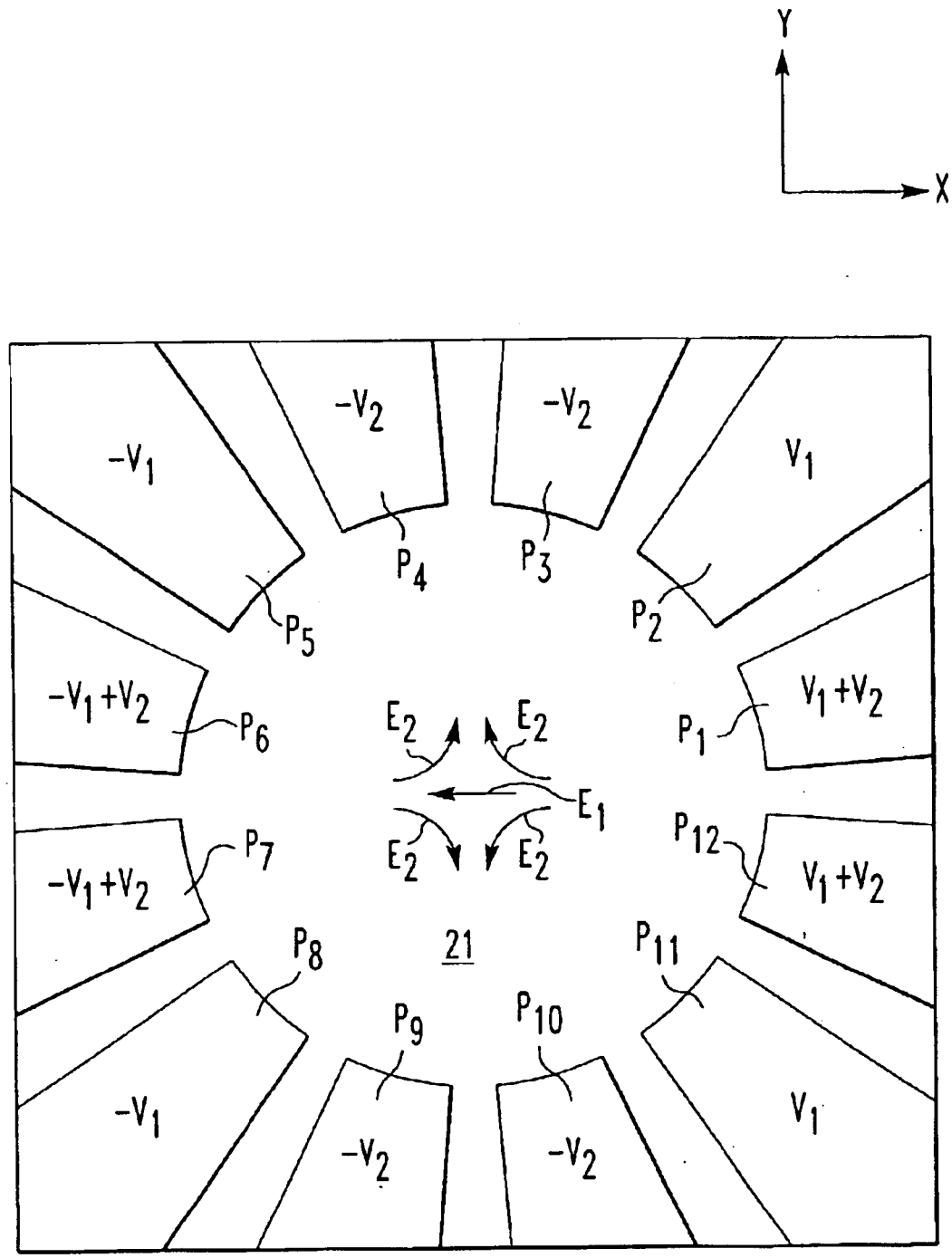
FIG. 3 is a view similar to FIG. 1, but illustrating the magnitudes of electric potentials applied to the various poles of the Wien filter shown in FIG. 1.

FIG. 3 shows electric potentials applied to the poles $P_1$ to $P_{12}$ to produce the dipole electric field $E_1$ and quadrupole electric field $E_2$ inside the cylindrical space 21 whose center axis is coincident with the optical axis O. As shown in this figure, within the XY-plane perpendicular to the optical axis O, a first potential $V_1$ is applied to the four poles $P_1$, $P_{12}$, $P_6$, and $P_7$ whose front ends are substantially in the X-axis direction. The first potential $V_1$ is also applied to the four poles $P_2$, $P_{11}$, $P_5$, and $P_8$ whose front ends are at about 45° to the X-axis.

More specifically, the positive potential $V_1$ is applied to the poles $P_1$ and $P_{12}$ extending at angles of ±15° to the positive side of the X-axis and to the poles $P_2$ and $P_{11}$ extending at angles of ±165° to the positive side of the X-axis. The negative potential $-V_1$ is applied to the poles $P_6$ and $P_7$ extending at angles of ±165° to the positive side of the X-axis and to the poles $P_5$ and $P_8$ extending at angles of ±135° to the positive side of the X-axis.

To superimpose the quadrupole electric field $E_2$ on the dipole magnetic field $E_1$, a second electric potential of $V_2$ is applied to the four poles $P_1$, $P_{12}$, $P_6$, and $P_7$ whose front ends are substantially parallel to the X-axis and also to the four poles $P_3$, $P_4$, $P_9$, and $P_{10}$ whose front ends are substantially parallel to the Y-axis. More specifically, the potential $V_2$ applied to the poles $P_1$, $P_{12}$, $P_6$, and $P_7$ is positive, while the potential $V_2$ applied to the poles $P_3$, $P_4$, $P_9$, and $P_{10}$ is negative. As mentioned previously, the poles $P_4$ and $P_3$ extend at angles of ±15° to the positive side of the Y-axis, and the poles $P_9$ and $P_{10}$ extend at angles of ±165° to it.

Figure 4:
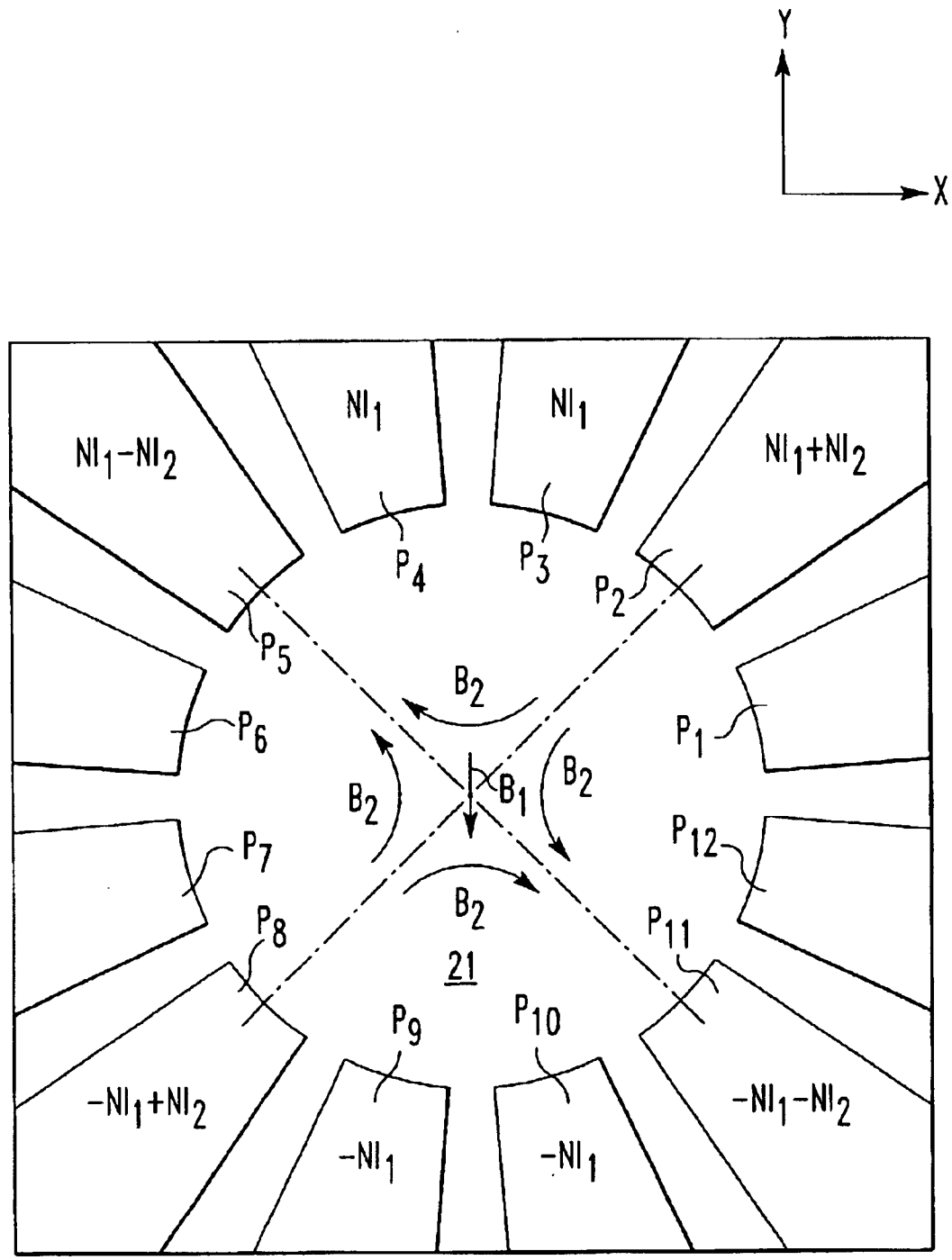
FIG. 4 is a view similar to FIG. 1, but illustrating the magnitudes or values of magnetomotive forces (in ampere-turns) applied to the various poles of the Wien filter shown in FIG. 1.

FIG. 4 shows magnetic potentials or magnetomotive forces applied to the poles $P_1$ and $P_{12}$ to produce dipole magnetic field $B_1$ and quadrupole magnetic field $B_2$ in the cylindrical space 21. More specifically, as shown in this figure, a first magnetomotive force of $NI_1$ (in ampere-turns) is applied to the four poles $P_3$, $P_4$, $P_9$, and $P_{10}$ whose front ends are substantially parallel to the Y-axis (more specifically at angles of 75°, 105°, 255°, and 285°, respectively, to the positive side of the X-axis) and to the four poles $P_2$, $P_5$, $P_8$, and $P_{11}$ whose front ends are at an angle of 45° to the X-axis.

To superimpose the quadrupole magnetic field $B_2$ on the dipole magnetic field $B_1$, a second magnetomotive force of $NI_2$ (in ampere-turns) is applied to the four poles $P_2$, $P_5$, $P_8$, and $P_{11}$ whose front ends are at an angle of about 45° to the X-axis.

In the above-described configuration, high-order inhomogeneous components $E_3$ and $B_3$ of the dipole electric field $E_1$ and dipole magnetic field $B_1$, respectively, in the fringing fields can be made quite small.

More specifically, in the configuration described above, the gaps $G_1$ to $G_{12}$ formed between the poles $P_1$ and $P_{12}$ and the side surfaces of the poles $P_1$ to $P_{12}$ facing the gaps $G_1$ to $G_{12}$ are arranged with a 12-fold rotational symmetry. On the other hand, the high-order inhomogeneous components $E_3$ and $B_3$ of the dipole electric field $E_1$ and dipole magnetic field $B_1$, respectively, originate from the side surfaces of the poles $P_1$ and $P_{12}$ that face the gaps $G_1$ and $G_{12}$. Accordingly, in this embodiment, since the side surfaces of the poles $P_1$ and $P_{12}$ facing the gaps are arranged with a 12-fold symmetry, the high-order inhomogeneous components $E_3$ and $B_3$ cancel out, leaving behind only a small total value. This theory applies especially well to the case of the high-order inhomogeneous components $E_3$ and $B_3$ in the fringing fields.

Therefore, in the Wien filter of this embodiment, the high-order inhomogeneous components $E_3$ and $B_3$ can be made quite small. Hence, the values of the components $E_3$ and $B_3$ can be adjusted to satisfy the Rose's condition maximally. As a result, aberration in the electron beam in the Wien filter can be reduced.

Figure 5:
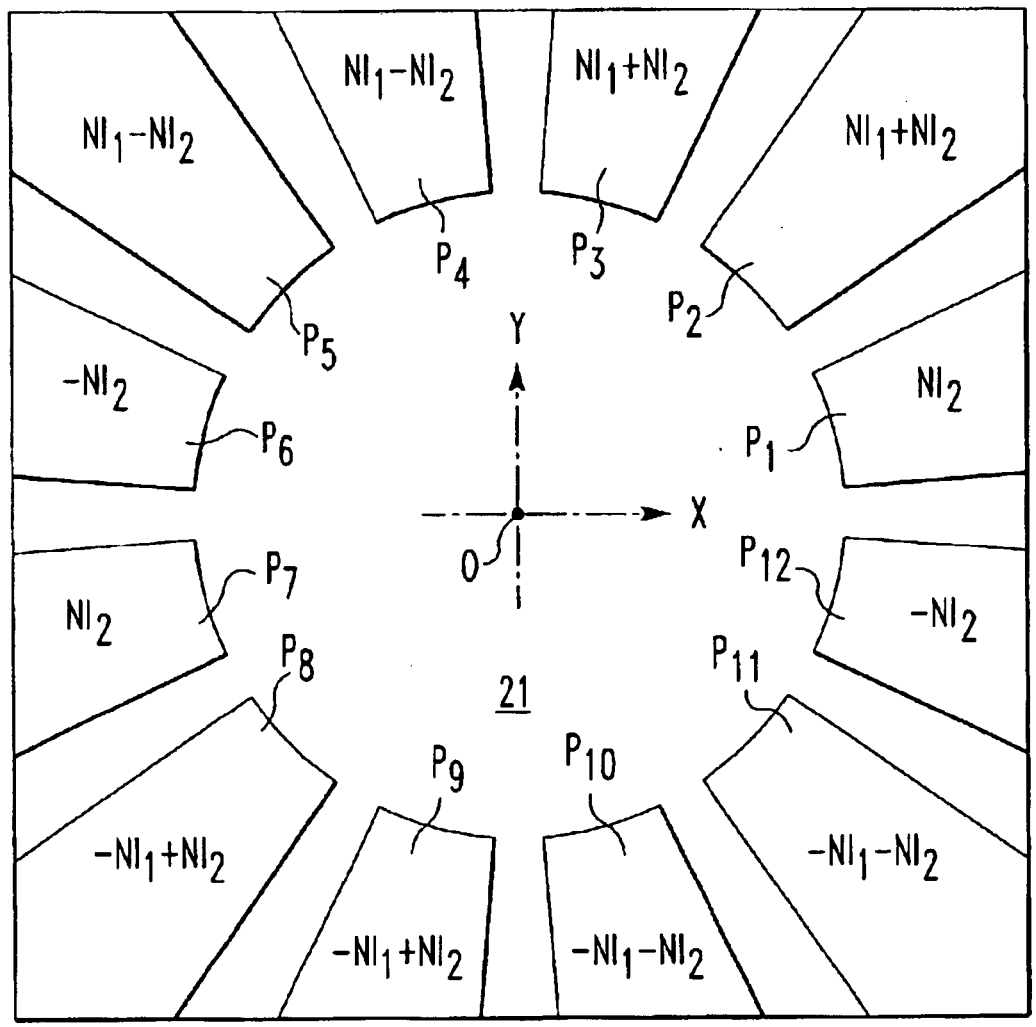
FIG. 5 is a schematic diagram of a Wien filter according to a second embodiment of the present invention.

Referring next to FIG. 5, there is shown a Wien filter according to a second embodiment of the present invention. The 12 poles $P_1$ to $P_{12}$ of this filter are similar in geometry and dimensions to their respective counterparts of the instrument according to the first embodiment already described. Potentials $V_1$ and $V_2$ are applied to these poles $P_1$ to $P_{12}$ to produce the dipole electric field $E_1$ and quadrupole electric field $E_2$ as shown in FIG. 3 in the same way as in the first embodiment. In addition, a magnetomotive force $NI_1$ is applied to the poles $P_2$–$P_5$ and to $P_8$–$P_{11}$ to produce dipole magnetic field $B_1$ as shown in FIG. 5 in the same way as in the first embodiment.

On the other hand, a magnetomotive force $NI_2$ acting as a third magnetomotive force having a positive value is applied to the three poles $P_1$ to $P_3$ whose front ends are located within the first quadrant of the XY-coordinate system whose origin lies at the optical axis O. A magnetomotive force $-NI_2$ acting as the third magnetomotive force having a negative value is applied to the three poles $P_4$ to $P_6$ located within the second quadrant. A magnetomotive force $NI_2$ acting as the third magnetomotive force having a positive value is applied to the three poles $P_7$ to $P_9$ located within the third quadrant. A magnetomotive force $-NI_2$ acting as the third magnetomotive force having a negative value is applied to the three poles $P_{10}$ to $P_{12}$ located within the fourth quadrant. As already understood, the second and third magnetomotive forces are equal in this embodiment.

This second embodiment yields advantages similar to those derived by the first embodiment. That is, high-order inhomogeneous components $E_3$ and $B_3$ of the dipole electric field $E_1$ and dipole magnetic field $B_1$, respectively, in the fringing fields can be made infinitesimal. Aberration in the energy filter can be reduced by adjusting these components to desired values.

In the first and second embodiments described above, the gaps $G_1$ to $G_{12}$ between the front ends of the poles $P_1$ to $P_{12}$ increase in going along the radius. The gaps may also be regularly spaced from each other in a radial direction (i.e., the walls of the poles are parallel).

The Wien filter of this embodiment shown in FIG. 1 had the following geometry and dimensions:

$R_0$ (radius of the cylindrical space through which electrons pass within the XY-plane)=5 mm $L_0$ (length of the Wien filter taken in the Z-axis direction)= 40 mm $\theta_0$ (angle between lines passing through the centers of the gaps $G_1$ to $G_{12}$ between the poles)=30°

$\delta\theta$ (lateral width of each gap)=6°

The accelerating voltage was 2.5 kV. The following potentials and magnetomotive forces were applied by the method of the first embodiment (FIGS. 3 and 4) to the poles $P_1$ to $P_{12}$, respectively:

$V_1$=1642.4243 V $V_2$=326.5973 V $NI_1$=44.0753 AT $NI_2$=8.7060 AT

The dipole components $E_1$ and $B_1$, quadrupole components $E_2$ and $B_2$, and high-order inhomogeneous components $E_3$ and $B_3$ of the electric and magnetic fields, respectively, where the above-described potentials or magnetomotive forces were applied to the poles $P_1$ to $P_{12}$ were numerically calculated by the boundary element method (BEM).

The dipole component $E_1$ and quadrupole component $E_2$ of the electric field where the potential $V_1$ for the dipole electric field was 1 V were as follows. (Note that each actual value is equal to each of the following values multiplied by 1642.4243.)

$E_1$=218.6 $V/m$ $E_2$=43390 $V/m^2$

Where the magnetomotive force $NI_1$ for the dipole magnetic field was 1 ampere-turn (AT), the dipole magnetic component $B_1$ and quadrupole magnetic component $B_2$ were as follows. (Note that each actual value is equal to each of the following values multiplied by 44.0753.)

$B_1$=0.0002748 $T/m$ $B_2$=0.03142 $T/m^2$

These fulfill the Wien's condition ($E_1$=$vB_1$) and satisfy stigmatic focusing condition ($E_2/E_1-B_2/B_1=-1/4R$), where R is the cyclotron radius ($mv^2/eE_1$), where v is the velocity of electrons, m is the mass of each electron, and e is the charge of each electron.

Figure 6A:
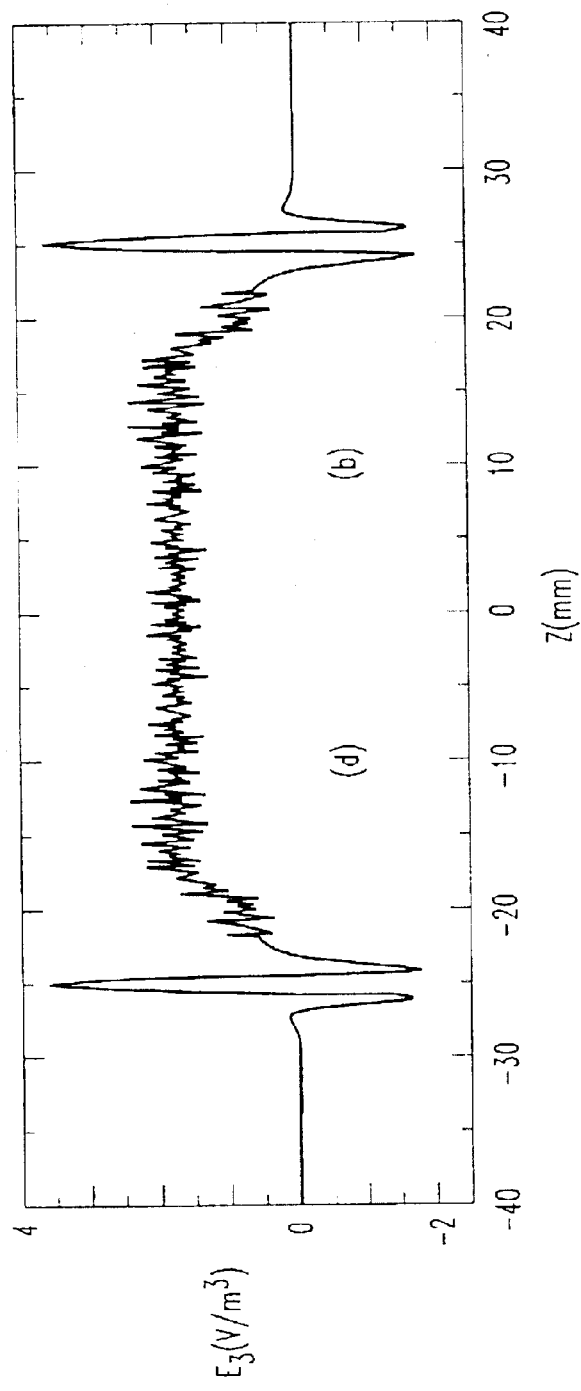
FIGS. 6(a) and 6(b) are graphs showing the intensity distribution of the high-order inhomogeneous component $E_3$ of an electric field produced in a Wien filter according to an embodiment of the present invention, the distribution being taken along the optical axis.
Figure 6B:
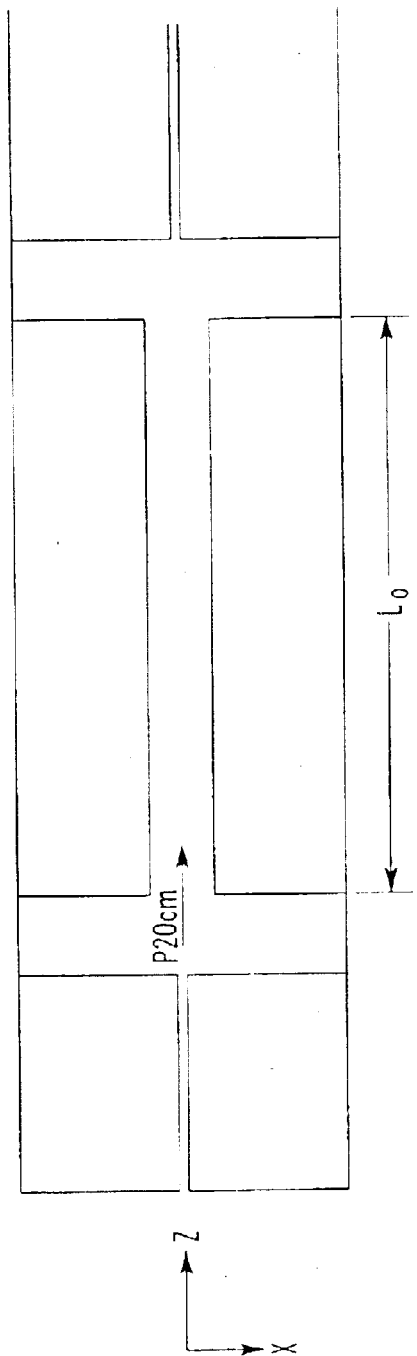
Figure 8A:
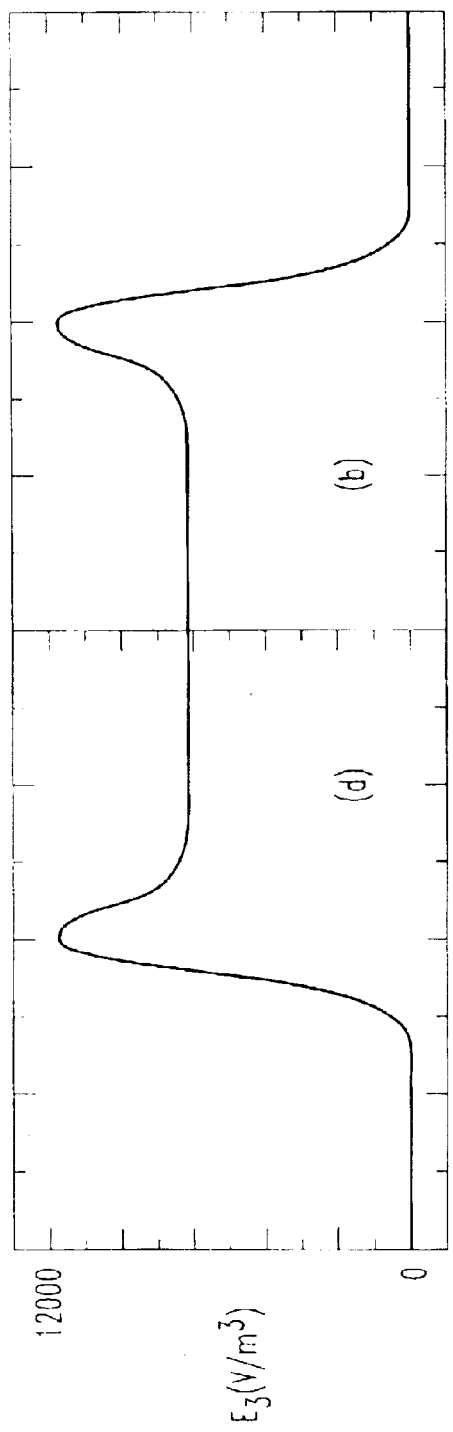
FIGS. 8(a) and 8(b) are diagrams showing the distribution of a high-order inhomogeneous component $E_3$ produced when a dipole electric field of 1 V is applied, the distribution being taken along the optical axis.
Figure 8B:
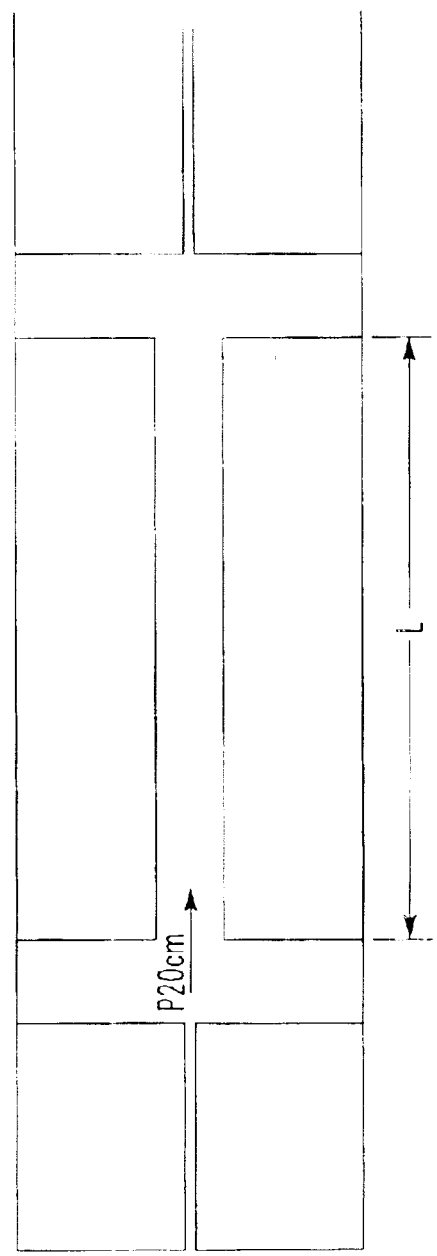
Figure 9A:
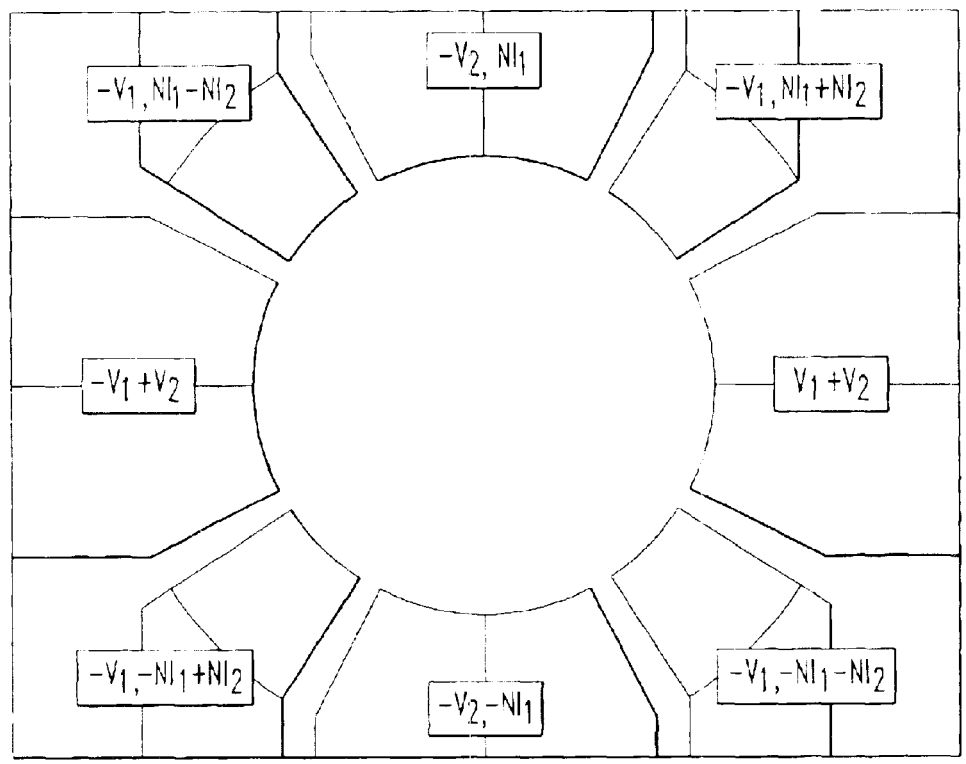
FIGS. 9(a) and 9(b) show an example of an octopole filter.
Figure 9B:
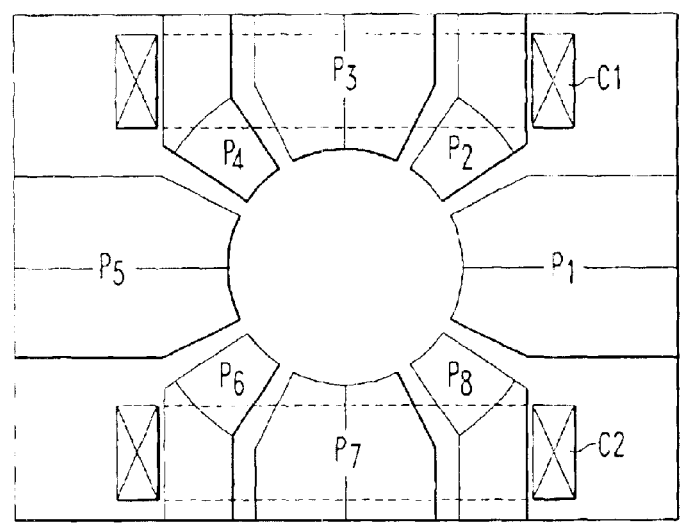

FIGS. 6(a) and 6(b) show the intensity distribution of the high-order inhomogeneous component $E_3$ of the above-described electric field in the Z-axis direction in this embodiment. As can be seen by comparison of FIGS. 6(a) and 6(b) with FIGS. 8(a) and 8(b), the value of the high-order inhomogeneous component $E_3$ is reduced to about $10^{-4}$ compared with the octopole Wien filter. The high-order inhomogeneous component $B_3$ similarly decreases in a manner not illustrated.

In this embodiment, $E_3$ and $B_3$ assume very small values in this way. Accordingly, the aberration correction condition can be satisfied by setting the high-order inhomogeneous components $E_3$ and $B_3$ of the electric and magnetic fields to desired values.

In other words, the magnitudes of the inhomogeneous components $E_3$ and $B_3$ of the electric and magnetic fields can be reduced to about $10^{-4}$ by varying the number of poles of the Wien filter from 8 to 12. Therefore, aberration in the filter can be corrected.

Figure 7A:
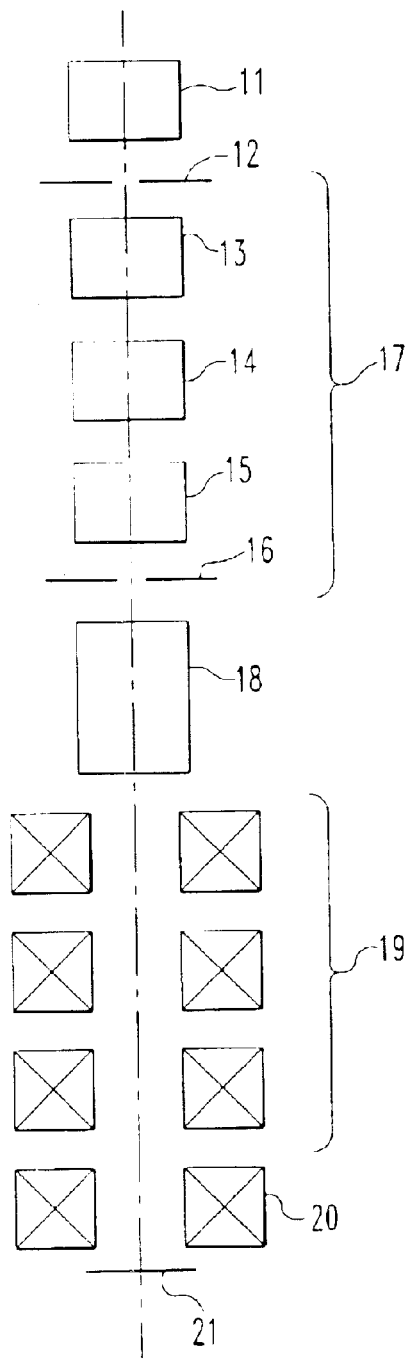
FIGS. 7(a) and 7(b) are graphs showing the configuration of an electron microscope incorporating a Wien filter according to the present invention.
Figure 7B:
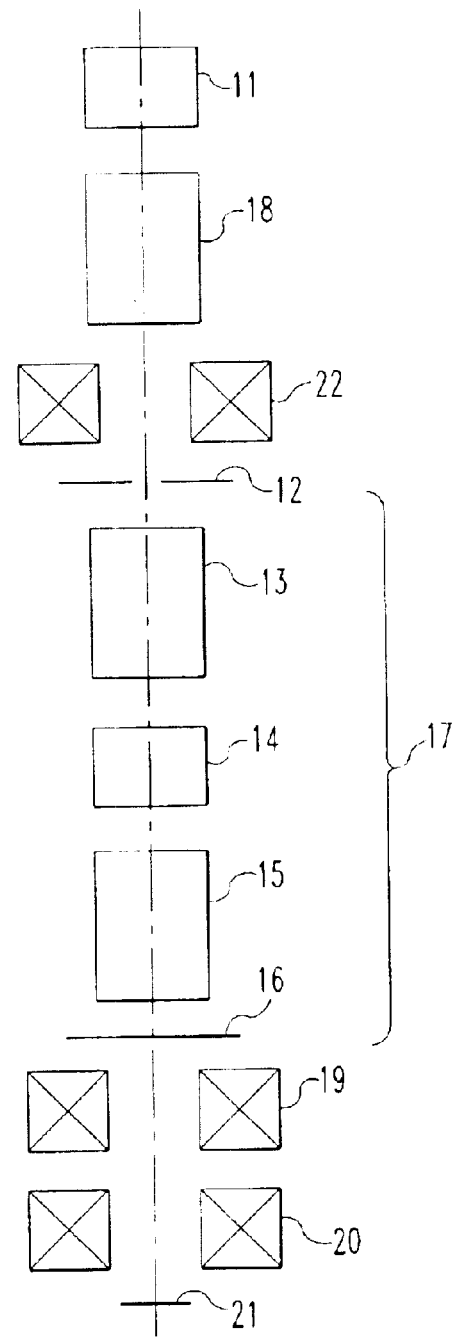

FIGS. 7(a) and 7(b) show the configuration of an electron microscope incorporating a Wien filter according to the present invention. FIG. 7(a) shows an embodiment in which the Wien filter according to the present invention is placed between an FEG and an accelerator. A beam of electrons having relatively low energies of 1 keV to several kilovolts is produced by the FEG, 11, and enters a deceleration type energy filter 17 consisting of an entrance aperture 12, a deceleration portion 13, a Wien filter 14, an acceleration portion 15, and an exit aperture 16. In this deceleration type energy filter 17, the incident electrons are decelerated to energies of hundreds of eV by the deceleration portion and then only electrons having a given energy are selected by the Wien filter 14. The electrons are accelerated back to the original energies by the accelerating portion 15. Then, they exit from the exit aperture 16. The Wien filter 14 has the structure of the first embodiment (FIGS. 3 and 4) or the second embodiment (FIGS. 3 and 5).

The electron beam going out of the exit aperture 16 is accelerated to a desired high energy (e.g., about 200 keV) by an accelerator 18. Then, the beam is made to strike a sample 21 via condenser lenses 19 and an objective lens 20. A TEM image created by the electron beam transmitted through the sample 21 is then magnified by an intermediate lens (not shown) and a projector lens (not shown). The image is then projected onto a fluorescent screen (not shown) located behind the projector lens.

FIG. 7(b) shows an embodiment in which a Wien filter according to the present invention is placed behind an accelerator. In this embodiment, a beam of electrons having relatively low energies of 1 keV to several kilovolts is produced by the FEG, 11, and then accelerated to a desired high energy (e.g., about 200 keV) by an accelerator 18. Then, the beam enters a deceleration type energy filter 17 via condenser lenses 22, the energy filter consisting of an entrance aperture 12, a deceleration portion 13, a Wien filter 14, an acceleration portion 15, and an exit aperture 16. In this deceleration-type energy filter 17, the incident electrons are decelerated to energies of hundreds of eV by the deceleration portion and then only electrons having a given energy are selected by the Wien filter 14. The electrons are accelerated back to the original energies by the accelerating portion 15. Then, they exit from the exit aperture 16. The Wien filter 14 has the structure of the first embodiment (FIGS. 3 and 4) or the second embodiment (FIGS. 3 and 5).

The electron beam going out of the exit aperture 16 is made to strike a sample 21 via condenser lenses 19 and an objective lens 20. A TEM image created by the electron beam transmitted through the sample 21 is then magnified by an intermediate lens (not shown) and a projector lens (not shown). The image is then projected onto a fluorescent screen (not shown) located behind the projector lens.

In this embodiment of FIG. 7(b), the deceleration portion 13 and acceleration portion 15 of the deceleration-type energy filter 17 need to accelerate high-energy electrons to hundreds of eV and to accelerate back to the original high energies. Therefore, multistage deceleration and multistage acceleration using multiple stages of electrodes are preferably employed in the same way as the original accelerator 18.

Where the above-described Wien filter according to the present invention is used as an analyzer, the Wien filter may be positioned downstream of the sample, e.g., between the objective lens and the projector lens.

As described thus far, in the Wien filter according to the present invention, high-order inhomogeneous components of electric and magnetic fields can be made small. Aberration in the Wien filter can be reduced.

Having thus described our invention with the detail and particularity required by the Patent Laws, what is desired protected by Letters Patent is set forth in the following claims.

The invention claimed is:

1. A Wien filter having an optical axis substantially parallel to a Z-axis, the Wien filter producing at least a dipole electric field in the direction of an X-axis and a dipole magnetic field in the direction of a Y-axis, said Wien filter comprising:
    12 poles extending substantially parallel to the optical axis in the direction of the Z-axis, said 12 poles having front ends facing the optical axis within an XY-plane, said front ends having a 12-fold rotational symmetry about the optical axis,
    wherein two axes perpendicular to said optical axis are assumed to be the X- and Y-axes,
    wherein a first electric potential of positive or negative sign is applied to four ones of said 12 poles whose front ends are substantially parallel to the X-axis and also applied to four ones of said 12 poles whose front ends are at an angle of 45 to the X-axis to produce the dipole electric field, and
    wherein a first magnetic potential or magnetomotive force of positive or negative sign is applied to four ones of said 12 poles whose front ends substantially parallel to the Y-axis and also applied to four ones of said 12 poles whose front ends are at an angle of 45 to the Y-axis to produce the dipole magnetic field.

2. The Wien filter of claim 1, wherein a second electric potential of positive or negative sign is applied to four ones of said 12 poles whose front ends are substantially parallel to said X-axis and also applied to four ones of said 12 poles whose front ends are substantially parallel to the Y-axis to superimpose a quadrupole electric field on said dipole electric field.

3. The Wien filter of claim 1 or 2, wherein a second magnetic potential or magnetomotive force of positive or negative sign is applied to four ones of said 12 poles whose front ends are each at an angle of about 45 to the X-axis or Y-axis to superimpose a quadrupole magnetic field on said dipole magnetic field.

4. The Wien filter of claim 1 or 2, wherein a third magnetic potential or magnetomotive force having a positive value is applied to three ones of said 12 poles whose front ends are located in the first quadrant of an XY coordinate system which are defined by said X- and Y-axes and whose origin lies at said optical axis, the third magnetic potential or magnetomotive force having a negative value is applied to three ones of said 12 poles whose front ends are located in the second quadrant, the third magnetic potential or magnetomotive force having a positive value is applied to three ones of said 12 poles whose front ends are located in the third quadrant, and the third magnetic potential or magnetomotive force having a negative value is applied to three ones of said 12 poles whose front ends are located in the fourth quadrant.

5. The Wien filter of claim 1 or 2, wherein said front ends of said 12 poles are located on a circle that has a given radius and is centered at the optical axis within an XY-plane defined by said X- and Y-axes, and wherein the length of each of said front ends taken along said radius is comparable to or greater than the radius of said circle.

6. The Wien filter of claim 1 or 2, wherein said 12 poles are made of a magnetic material.

7. An electron microscope comprising:

an electron gun for producing an electron beam;

a Wien filter for passing only electrons having a certain energy, said electron beam being made to strike a sample via said Wien filter, said Wien filter having an optical axis substantially parallel to a Z-axis, said Wien filter producing at least a dipole electric field in the direction of an X-axis and a dipole magnetic field in the direction of a Y-axis; and 12 noles extending substantially parallel to the optical axis in the direction of the Z-axis, said 12 poles having front ends facing the optical axis, said front ends having a 12-fold rotational symmetry about the optical axis within an XY-plane.

wherein two axes perpendicular to said optical axis are assumed to be the X- and Y-axes, wherein a first electric potential of positive or negative sign is applied to four ones of said 12 poles whose front ends are substantially parallel to the X-axis and also applied to four ones of said 12 poles whose front ends are at an angle of 45 to the X-axis to produce the dipole electric field, and wherein a first magnetic potential or magnetomotive force of positive or negative sign is applied to four ones of said 12 poles whose front ends are substantially parallel to the Y-axis and also applied to four ones of said 12 poles whose front ends are at an angle of 45 to the Y-axis to produce the dipole magnetic field.

8. The electron microscope of claim 7, wherein a second electric potential of positive or negative sign is applied to four ones of said 12 poles whose front ends are substantially parallel to said X-axis and also applied to four ones of said 12 poles whose front ends are substantially parallel to the Y-axis to superimpose a quadrupole electric field on said dipole electric field.

9. The electron microscope of claim 7 or 8, wherein a second magnetic potential or magnetomotive force of positive or negative sign is applied to four ones of said 12 poles whose front ends are each at an angle of about 45 to the X-axis or Y-axis to superimpose a quadrupole magnetic field on said dipole magetic field.

10. The electron microscope of claim 7 or 8, wherein a third magnetic potential or magnetomotive force having a positive value is applied to three ones of said 12 poles whose front ends are located in the first quadrant of an XY coordinate system which are defined by said X- and Y-axes and whose origin lies at said optical axis, the third magnetic potential or magnetomotive force having a negative value is applied to three ones of said 12 poles whose front ends are located in the second quadrant, the third magnetic potential or magnetomotive force having a positive value is applied to three ones of said 12 poles whose front ends are located in the third quadrant, and the third magnetic potential or magnetomotive force having a negative value is applied three ones of said 12 poles whose front ends are located in the fourth quadrant.

11. The electron microscope of claim 7 or 8, wherein said front ends of said 12 poles are located on a circle that has a given radius and is centered at the optical axis within an XY-plane defined by said X- and Y-axis, and wherein the length of each of said front ends taken along said radius is comparable to or greater than the radius of said circle.

* * * * *

UNITED STATES PATENT AND TRADEMARK OFFICE
CERTIFICATE OF CORRECTION

PATENT NO. : 6,844,548 B2
DATED : January 18, 2005
INVENTOR(S) : Lopez et al.

It is certified that error appears in the above-identified patent and that said Letters Patent is hereby corrected as shown below:

Column 10,
Line 39, "front ends substantially" should read -- front ends are substantially --

Column 11,
Line 21, "12 noles" should read -- 12 poles --.
Line 25, "plane." should read -- plane, --

Column 12,
Line 29, "three ones" should read -- to three ones --

Signed and Sealed this

Nineteenth Day of July, 2005

JON W. DUDAS
*Director of the United States Patent and Trademark Office*